(12) United States Patent
Yugawa

(10) Patent No.: US 12,245,366 B2
(45) Date of Patent: Mar. 4, 2025

(54) WIRING BOARD

(71) Applicant: Kyocera Corporation, Kyoto (JP)

(72) Inventor: Hidetoshi Yugawa, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 285 days.

(21) Appl. No.: 17/771,640

(22) PCT Filed: Aug. 21, 2020

(86) PCT No.: PCT/JP2020/031575
§ 371 (c)(1),
(2) Date: Apr. 25, 2022

(87) PCT Pub. No.: WO2021/084860
PCT Pub. Date: May 6, 2021

(65) Prior Publication Data
US 2022/0418098 A1    Dec. 29, 2022

(30) Foreign Application Priority Data
Oct. 30, 2019    (JP) .................................. 2019-197805

(51) Int. Cl.
*H05K 1/02* (2006.01)
*H05K 1/09* (2006.01)
(Continued)

(52) U.S. Cl.
CPC ............. *H05K 1/0271* (2013.01); *H05K 1/09* (2013.01); *H05K 1/116* (2013.01); *H05K 3/429* (2013.01);
(Continued)

(58) Field of Classification Search
CPC ........ H05K 1/116; H05K 1/115; H05K 3/429; H05K 3/38
See application file for complete search history.

(56) References Cited

U.S. PATENT DOCUMENTS

| | | | | |
|---|---|---|---|---|
| 5,227,012 A | * | 7/1993 | Brandli | H05K 1/167 428/209 |
| 2005/0258522 A1 | * | 11/2005 | En | H05K 3/067 257/670 |
| 2008/0030965 A1 | * | 2/2008 | Lien | H05K 1/162 29/830 |

(Continued)

FOREIGN PATENT DOCUMENTS

| | | |
|---|---|---|
| JP | 07-147483 A | 6/1995 |
| JP | 2016-035969 A | 3/2016 |

(Continued)

*Primary Examiner* — Hoa C Nguyen
*Assistant Examiner* — Amol H Patel
(74) *Attorney, Agent, or Firm* — Volpe Koenig

(57) ABSTRACT

A wiring board includes: first and second insulating layers; a first wiring conductor layer located between the first and second insulating layers and including a first via land; a second wiring conductor layer located on the second insulating layer and including a second via land; a via hole penetrating from the upper to lower surfaces of the second insulating layer; and a via conductor located in the via hole and electrically connecting the first second via lands. The via conductor is located on the inner surface of the via hole and on the first via land via a first base layer containing nichrome and a second base layer located on the upper surface of the first base layer and containing the same metal as the via conductor. An alloy layer containing tin and nichrome is located between the first via land and the first base layer.

12 Claims, 3 Drawing Sheets

(51) Int. Cl.
*H05K 1/11* (2006.01)
*H05K 3/00* (2006.01)
*H05K 3/38* (2006.01)
*H05K 3/42* (2006.01)
*H05K 3/46* (2006.01)

(52) U.S. Cl.
CPC ......... *H05K 3/4644* (2013.01); *H05K 3/0035* (2013.01); *H05K 3/389* (2013.01); *H05K 2201/0341* (2013.01); *H05K 2201/09454* (2013.01); *H05K 2201/09509* (2013.01)

(56) References Cited

U.S. PATENT DOCUMENTS

| | | | | |
|---|---|---|---|---|
| 2009/0223700 | A1* | 9/2009 | Youngner | H05K 3/4038 |
| | | | | 216/13 |
| 2009/0242252 | A1* | 10/2009 | Tanaka | H01L 24/32 |
| | | | | 174/260 |
| 2009/0244865 | A1* | 10/2009 | Tanaka | H01L 23/5389 |
| | | | | 361/764 |
| 2011/0314666 | A1* | 12/2011 | Harazono | H05K 3/4644 |
| | | | | 216/13 |
| 2017/0103942 | A1* | 4/2017 | Oi | H01L 24/09 |
| 2018/0376602 | A1* | 12/2018 | Matsuura | C23C 18/1653 |
| 2019/0371717 | A1* | 12/2019 | Kita | H01L 21/4857 |

FOREIGN PATENT DOCUMENTS

| | | |
|---|---|---|
| JP | 2017-73520 A | 4/2017 |
| JP | 2012-074687 A | 4/2021 |

\* cited by examiner

WIRING BOARD

TECHNICAL FIELD

The present invention relates to a wiring board.

BACKGROUND ART

A wiring board includes a plurality of insulating layers and wiring conductor layers formed on the surface of the insulating layers, as illustrated in Patent Document 1, for example. A via conductor is formed in the insulating layer, and via the via conductor, electrical connection between wiring conductor layers formed in the different insulating layers, that is, electrical connection is performed in the thickness direction of the wiring board.

CITATION LIST

Patent Literature

Patent Document 1: JP 2017-73520 A

SUMMARY

A wiring board according to the present disclosure includes: a first insulating layer and a second insulating layer; a first wiring conductor layer located between the first insulating layer and the second insulating layer and including a first via land; a second wiring conductor layer located on the second insulating layer and including a second via land; a via hole penetrating from the upper surface to the lower surface of the second insulating layer; and a via conductor located in the via hole and electrically connecting the first via land and the second via land. The via conductor is located on the inner surface of the via hole and on the first via land via a first base layer containing nichrome and a second base layer located on the upper surface of the first base layer and containing the same metal as that forming the via conductor. An alloy layer containing the same metal as that forming the first wiring conductor layer, tin, and nichrome is located between the first via land and the first base layer.

A method of manufacturing a wiring board according to the present disclosure, includes: layering a second insulating layer via a metal layer containing tin and a layer containing a coupling agent, on a first wiring conductor layer located on a first insulating layer and including a first via land; forming, in the second insulating layer, a via hole penetrating from the upper surface to the lower surface of the second insulating layer; forming, by sputtering, a first base layer formed of nichrome on the inner surface of the via hole and the upper surface of the first via land; forming, by sputtering, a second base layer on the upper surface of the first base layer; and forming the via conductor in the via hole.

DESCRIPTION OF EMBODIMENTS

In the related art, there has been a problem in a via conductor connection between insulating layers of a wiring board, and in particular, via diameter has been reduced in accordance with the recent refinement of design rules. As a result, the connection reliability issue has received more attention.

The wiring board according to the present disclosure is provided with an alloy layer of metal forming the first wiring conductor layer, tin, and nichrome, between the first via land and the first base layer as described above. Such an alloy layer has a lower Young's modulus than the first base layer formed of nichrome. Thus, the alloy layer acts as a buffer material between the first via land and the first base layer to reduce the occurrence of cracks between the first via land and the via conductor. In addition, such an alloy layer is provided to facilitate the connection of crystals of the metal forming the first via land, crystals of the nichrome forming the first base layer, crystals of the metal forming the second base layer, and crystals of the metal forming the via conductor, with continuous crystals. In other words, the orientation states of the crystals of the metal forming the first via land, the crystals of the nichrome forming the first base layer, the crystals of metal forming the second base layer, and the crystals of the metal forming the via conductor tend to be the same. As a result, in the wiring board according to the present disclosure, the connection reliability between the via land and the via conductor increases.

Figure 1:
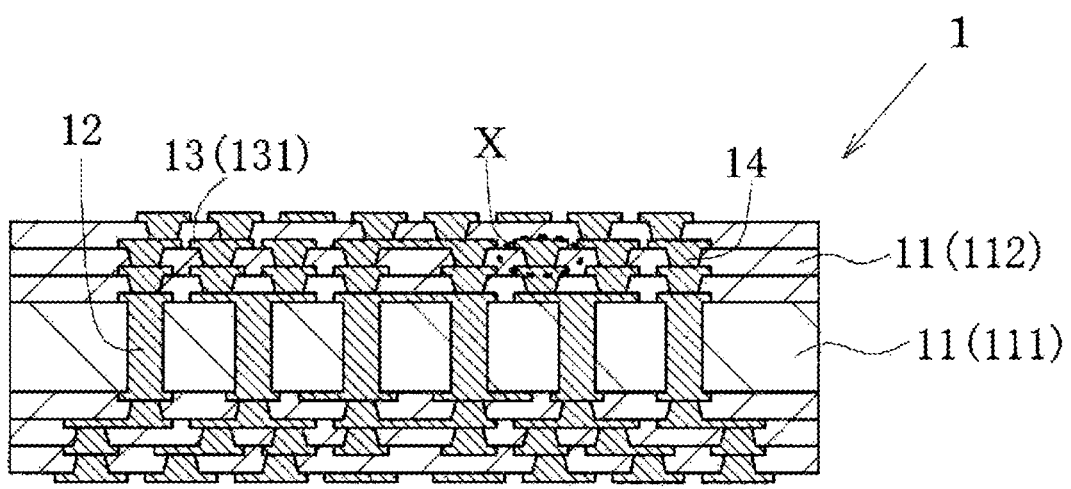
FIG. 1 is a schematic view illustrating a wiring board according to one embodiment of the present disclosure.

A wiring board according to one embodiment of the present disclosure will be described with reference to FIGS. 1 and 2. FIG. 1 is a schematic view illustrating a wiring board 1 according to one embodiment of the present disclosure.

The wiring board 1 according to the embodiment includes a plurality of insulating layers 11, a wiring conductor layer 13 located on each surface of the insulating layers 11 and including a via land 131, a via hole penetrating from the upper surface to the lower surface of the insulating layer 11, and a via conductor 14 located in the via hole.

The insulating layer 11 may be formed of any insulating material. Examples of the insulating material include resins such as epoxy resins, bismaleimide-triazine resins, polyimide resins, polyphenylene ether resins, and liquid crystal polymers. These resins may be used alone or in combination of two or more resins. An inorganic insulating filler such as silica, alumina, barium sulfate, talc, clay, glass, calcium carbonate, titanium oxide may be further dispersed in the insulating layer 11.

In the wiring board 1 according to the embodiment, one of the plurality of insulating layers 11 is a core layer 111 and the remaining insulating layers 11 are build-up layers 112. The core layer 111 has a thickness of, for example, 30 µm to 8 mm. The most used thickness is 100 µm to 800 µm.

A through-hole conductor 12 is located in the core layer 111, and the thorough-hole electrically connects the wiring conductor layers 13 on the upper and lower surfaces of the core layer 111. The through-hole conductor 12 is located in a through-hole penetrating the upper and lower surfaces of the core layer 111. The through-hole conductor 12 is formed of metal plating such as copper plating. The through-hole conductor 12 connects to the wiring conductor layers 13 located on both surfaces of the core layer 111. The through-hole conductor 12 may be formed only on the inner wall surface of the through-hole or may be filled in the through-hole.

The build-up layer 112 has a thickness of 1 µm to 60 µm, for example. The most used thickness is 5 µm to 20 µm. The build-up layers 112 may be the same resin or different resins.

The wiring conductor layer 13 is located on the surface of the insulating layer 11, that is, on the surface of the core layer 111 and on the surface of the build-up layer 112. The wiring conductor layer 13 is formed of a conductor such as copper, for example, copper foil or copper plating. The thickness of the wiring conductor layer 13 is not particularly limited and is, for example, 1 μm to 30 μm. The most applicable thickness is 4 μm to 12 μm. When a plurality of wiring conductor layers 13 are provided, the wiring conductor layers 13 can be the same conductor or different conductors. Some of the wiring conductor layers 13 are used as an via land 131 for connecting a via conductor 14, which will be described later.

The build-up layer 112 is formed with a via conductor 14 for electrically connecting the upper and lower surfaces of the build-up layer 112. The via conductor 14 is obtained by depositing a conductor such as copper, for example, copper plating, in a hole (via hole) penetrating the upper and lower surfaces of the build-up layer 112. The via hole penetrating the upper and lower surfaces of the build-up layer 112 has, for example, an inner diameter of 5 μm to 80 μm at the bottom. The via hole is formed by a laser machining process such as a $CO_2$ laser or a UV-YAG laser. The via conductor 14 may be located in a state of filling the inside of the via hole, and resin is filled in the portion where the via conductor 14 is adhered to the inside surface of the via hole and the via conductor 14 is not provided.

Figure 2:
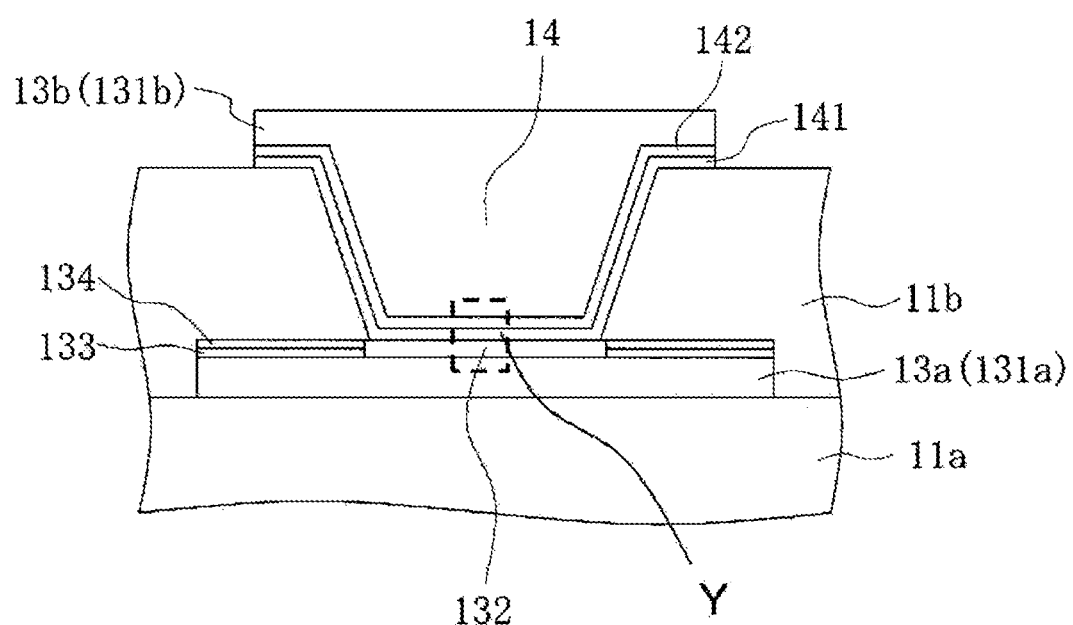
FIG. 2 is an enlarged explanatory view for illustrating a region X illustrated in FIG. 1.

FIG. 2 is an enlarged explanatory view for illustrating a region X illustrated in FIG. 1. In FIG. 2, the insulating layer located on the lower side is described as a first insulating layer 11a, and the insulating layer located on the upper side is described as a second insulating layer 11b. A wiring conductor layer and a via land, which are located on the first insulating layer 11a, are described as a first wiring conductor layer 13a and a first via land 131a, respectively. A wiring conductor layer and a via land, which are located on the second insulating layer 11b, are described as a second wiring conductor layer 13b and a second via land 131b, respectively. As illustrated in FIG. 2, a first base layer 141 and a second base layer 142 formed on the surface of the first base layer 141 are located on the inner surface of the via hole formed in the second insulating layer 11b.

The first base layer 141 is formed of nichrome and has a thickness of, for example, 5 nm to 30 nm. The second base layer 142 is formed of the same metal as that forming the via conductor 14. Thus, when the via conductor 14 is formed of copper, then the second base layer 142 is also formed of copper. The second base layer 142 has a thickness of, for example, 150 nm to 1000 nm.

The wiring board 1 according to the embodiment is provided with an alloy layer 132 at the bottom of the via conductor 14, that is, between the first via land 131a and the first base layer 141. The alloy layer 132 is formed of an alloy of metal forming the first wiring conductor layer 13a (first via land 131a), tin, and nichrome. For example, when the first wiring conductor layer 13a (first via land 131a) is formed of copper, the alloy layer 132 is formed of an alloy of copper, tin, and nichrome.

The tin contained in the alloy layer 132 is derived from tin included in a metal layer 133 containing tin and formed on the surface of the first via land 131a. The metal layer 133 containing tin, which will be described later, and a layer 134 containing a coupling agent are used to improve the adhesion strength between the first wiring conductor layer 13a (first via land 131a) and the second insulating layer 11b.

Thus, the alloy layer 132 formed of an alloy containing tin is provided to reduce the stress between the first via land 131a and the via conductor 14. As a result, crack generation can be reduced. Nickel contained in nichrome has a high Young's modulus and commonly tends to increase stress. Thus, tin having a low Young's modulus is contained in the alloy layer 132 to reduce the Young's modulus of the alloy layer 132. As a result, the alloy layer 132 acts as a buffer material to reduce the stress, such that the occurrence of cracks between the first via land 131a and the via conductor 14 can be reduced.

Further, the alloy layer 132 formed of a tin-containing alloy is provided to facilitate the connection of crystals of the metal (for example, copper) forming the first via land 131a, crystals of the nichrome forming the first base layer 141, crystals of the metal (for example, copper) forming the second base layer 142, and crystals of the metal (for example, copper) forming the via conductor 14, with continuous crystals across the boundaries of the respective metals. In other words, the orientation states of the crystals of the metal (for example, copper) forming the first via land 131a, the crystals of the nichrome forming the first base layer 141, the crystals of the metal (for example, copper) forming the second base layer 142, and the crystals of the metal (for example, copper) forming the via conductor 14, tend to be the same across the boundaries of the respective metals. As a result, the bonding strength between the first via land 131a and the via conductor 14 is improved, which increases the connection reliability.

The alloy layer 132 may contain more tin in the center portion than in the peripheral edge portion of the first via land 131a. In such a case, the function of the alloy layer 132 as a buffer material can be enhanced at the center portion of a bonded portion between the first via land 131a and the via conductor 14. Furthermore, the crystal orientation described above is more likely to be the same at the center portion of the bonded portion between the first via land 131a and the via conductor 14. As a result, the bonding strength at the center portion can be improved, which is preferable in that the stress applied from various directions can be reduced with little deviation.

The alloy layer 132 can be confirmed by polishing a portion including, for example, the first via land 131a and the via conductor 14 to create a flat cross-section and observing the alloy layer 132 with a scanning electron microscope. The constituent elements of the alloy layer 132 confirmed by the scanning electron microscope can be confirmed by analysis using an electron probe microanalyzer.

Figure 3:
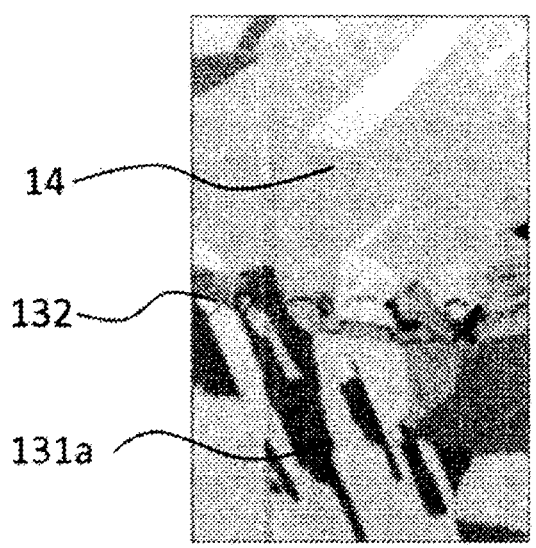
FIG. 3 is an electron micrograph illustrating an example of a region Y illustrated in FIG. 2.

In FIG. 2, boundary surfaces such as the first via land 131a, the alloy layer 132, and the via conductor 14 are illustrated in a smooth state for convenience. However, the actual boundary surfaces are not in a smooth state and, for example, are rough surfaces having irregularities with intricate metal crystal grains as illustrated in the electron micrograph of FIG. 3.

The method of manufacturing the wiring board according to the present disclosure is not limited. An example of a method of manufacturing a wiring board 1 according to one embodiment will be described.

The wiring board 1 according to one embodiment is obtained, for example, by a manufacturing method including the following steps (A) to (E):

(A) A step of forming a metal layer containing tin and a layer containing a coupling agent on the metal layer containing tin, and then layering an insulating layer on a wiring conductor layer including a via land;

(B) A step of forming, in the insulating layer, a via hole penetrating from the upper surface of the insulating layer to the via land;

(C) A step of forming, by sputtering, a first base layer formed of nichrome on the inner surface of the via hole;

(D) A step of forming, by sputtering, a second base layer formed of the same metal as that forming a via conductor on the surface of the first base layer; and (E) A step of forming the via conductor in the via hole.

In the step (A), the insulating layer 11 and the wiring conductor layer 13 are layered. Specifically, first, the core layer 111 (for example, first insulating layer 11a) in which through-holes are formed is prepared. The through-hole is formed by, for example, a drilling process, a laser machining process, or a blasting process. The thickness of the core layer 111 is as described above, and is, for example, 30 μm to 8 mm. The most used thickness is 100 μm to 800 μm.

Next, the wiring conductor layers 13 (for example, first wiring conductor layer 13a) are formed on both surfaces of the core layer 111, and the through-hole conductor 12 is formed in each of the through-holes. The wiring conductor layer 13 and the through-hole conductor 12 are formed as follows, for example. Base conductors are formed on both surfaces of the core layer 111 and through-hole wall surfaces by electroless copper plating. Next, a plating resist having an opening for forming a wiring pattern is formed by adhering a resist film to each of both surfaces of the core layer 111 and performing exposure and development. After that, electrolytic copper plating is performed to precipitate the copper plated metal in the opening and in the through-hole. Next, the plating resist is peeled off, and the base conductor located under the plating resist is removed by etching. As a result, the wiring conductor layers 13 are formed on the both surfaces of the core layer 111, and the through-hole conductor 12 is formed in the through-hole. The formed wiring conductor layer 13 includes the via land 131 (for example, first via land 131a). The through-hole conductor 12 formed in the core layer 111 is electrically connected to the wiring conductor layers 13 formed on both surfaces of the core layer 111.

Then, the metal layer 133 containing tin is formed on each of the upper and lower surfaces of the core layer 111. First, the upper and lower surfaces of the core layer 111 are surface-treated with dilute sulfuric acid or the like to remove the oxide film on the surfaces of the wiring conductor layer 13. Then, the metal layer 133 containing tin is formed by performing a tin plating treatment and further removing, by the nitric acid treatment, precipitated excess tin to adjust the thickness. The metal layer 133 containing tin has a thickness of, for example, 2 nm to 50 nm, and may have a thickness of 5 nm to 20 nm.

Next, a layer 134 containing a coupling agent is formed on the upper surface of the metal layer 133 containing tin. The layer 134 containing the coupling agent is formed by depositing the coupling agent on the metal layer 133 containing tin by, for example, immersion treatment to be then heated and dried. Examples of the coupling agent include silane coupling agents.

Next, the build-up layers 112 (for example, second insulating layer 11b) are formed on the upper and lower surfaces of the core layer 111 to obtain a laminate. The build-up layer 112 is formed, for example, by depositing films for the build-up layer 112 under vacuum on each of the upper and lower surfaces of the core layer 111 to be then thermoset. The thickness of the build-up layer 112 is as described above, and is, for example, 1 μm to 60 μm. The most used thickness is 5 μm to 20 μm. The build-up layer 112, as well as, the surface of the core layer 111 and the wiring conductor layer 13 formed on the surface of the core layer 111, are connected via the metal layer 133 containing tin described above and the layer 134 containing the coupling agent. The build-up layer 112 thus layered on each of the upper and lower surfaces of the core layer 111 is connected, via the layer 134 containing the coupling agent, to the wiring conductor layer 13, which improves the adhesion strength to each other.

Then, via holes penetrating the upper and lower surfaces of the build-up layer 112 are formed in the build-up layer 112. The via holes are formed by a laser such as a $CO_2$ laser or a UV-YAG laser. The inner diameter of the via hole is as described above, and is, for example, 5 μm to 80 μm.

The first base layer 141 is then formed on the inner surface and the bottom of the via hole. The first base layer 141 is formed of nichrome and by sputtering. The sputtering is performed under a low pressure of 20 Pa or less. The board surface temperature at the time of forming the first base layer 141 by sputtering (temperature of the build-up layer 112 on the outermost surface) is not particularly limited and is about 120° C. to 150° C. However, for example, the temperature of the bottom of the via hole (surface of the via land 131) reaches 250° C. or higher, which is higher than, at least, the melting point 232° C. of tin. Such a temperature increase occurs because the sputtered metal impacts the board, whose kinetic energy is then replaced by thermal energy. The difference in temperature between the board surface and the bottom of the via hole is due to the fact that heat is transmitted by radiation under a pressure of 20 Pa or less, but the emissivity of the resin portion is close to 1.0. However, the emissivity of the metal portion, especially copper, is only 0.1, which is ⅒ of the emissivity of the metal portion, thus it is difficult for heat to escape. These temperatures are measured, for example, using a thermocouple connected to the wiring board.

Sputtering at such a temperature forms the alloy layer 132 of tin contained in the metal layer 133 containing tin present at the bottom of the via hole, that is, on the surface of the via land 131, and metal (for example, copper) forming the via land 131 (wiring conductor layer 13) and nichrome formed by sputtering. Such an alloy layer 132 lies at least between the via land 131 and the first base layer 141.

After the first base layer 141 is formed on the inner surface and the bottom of the via hole, the second base layer 142 is formed on the surface of the first base layer 141. The second base layer 142 is formed of the same metal as that forming the via conductor 14 and is formed by sputtering, similar to the first base layer 141. The sputtering is performed under a low pressure of 20 Pa or less. The board surface temperature (temperature of the build-up layer 112 on the outermost surface) at the time of forming the second base layer 142 by sputtering is not particularly limited, and is about 180° C. to 200° C. However, for example, the temperature of the bottom of the via hole (surface of the via land 131) is at least higher than the melting point of tin of 232° C. and reaches the temperature not lower than that of the via land 131 at the time of forming the first base layer 141. This can facilitate the formation of the alloy layer 132. That is, when the heat at the time of forming the first base layer 141 causes the tin contained in the metal layer 133 containing tin, the metal (for example, copper) forming the via land 131 (wiring conductor layer 13), and the nichrome formed by sputtering to remain in a state that does not form an alloy, the heat at the time of forming the second base layer 142 can facilitate the formation of the alloy layer 132. When the via conductor 14 is formed of copper, then the second base layer 142 is also formed of copper.

Then, the via conductor 14 is formed in the via hole where the first base layer 141 and the second base layer 142 are formed. The via conductor 14 is formed simultaneously with a wiring conductor layer 13 (for example, second wiring conductor layer 13b) formed on the surface of the build-up layer 112 (for example, second insulating layer 11b), for example, by a semi-additive method. This improves the connection strength between the wiring conductor layer 13 formed on the surface of the build-up layer 112 and the via conductor 14.

Further, the steps from forming the build-up layer 112 to forming the via conductor 14 are repeated twice in the same manner to obtain the wiring board 1 having a build-up structure in which the three build-up layers 112 are layered on each of the upper and lower surfaces of the core layer 111.

The wiring board of the present disclosure is not limited to the embodiment described above. For example, in the wiring board 1 according to the embodiment described above, the alloy layer 132 is entirely formed between the via land 131 and the first base layer 141. However, the alloy layer 132 may not necessarily be formed entirely between the via land 131 and the first base layer 141. The alloy layer 132 may be formed intermittently between the via land 131 and the first base layer 141.

The wiring board 1 according to the one embodiment described above has a build-up structure in which three build-up layers 112 are layered on each of the upper and lower surfaces of the core layer 111. However, the number of layers of build-up layers 112 may be 1 or 2, or 4 or more.

REFERENCE SIGNS LIST

1 Wiring board
11a First insulating layer
11b Second insulating layer
111 Core layer
112 Build-up layer
12 Through-hole conductor
13a First wiring conductor layer
13b Second wiring conductor layer
131a First via land
131b Second via land
132 Alloy layer
133 Metal layer containing tin
134 Layer containing coupling agent
14 Via conductor
141 First base layer
142 Second base layer

The invention claimed is:

1. A wiring board, comprising:
a first insulating layer and a second insulating layer;
a first wiring conductor layer located between the first insulating layer and the second insulating layer and comprising a first via land;
a second wiring conductor layer located on the second insulating layer and comprising a second via land;
a via hole penetrating from an upper surface to a lower surface of the second insulating layer; and
a via conductor located in the via hole and electrically connecting the first via land and the second via land, wherein
the via conductor is located on an inner surface of the via hole and on the first via land via a first base layer containing nichrome and a second base layer located on an upper surface of the first base layer and containing the same metal as a metal forming the via conductor, and
an alloy layer containing the same metal as a metal forming the first wiring conductor layer, tin, and nichrome is located between the first via land and the first base layer.

2. The wiring board according to claim 1, wherein the alloy layer is located entirely between the first via land and the first base layer.

3. The wiring board according to claim 1, wherein the alloy layer contains more tin in a center portion of the first via land than in a peripheral edge portion of the first via land.

4. The wiring board according to claim 1, wherein the same metal as a metal forming the first wiring conductor layer is copper.

5. The wiring board according to claim 1, wherein the via conductor is located entirely within the via hole.

6. The wiring board according to claim 1, the wiring board comprising a portion in which a crystal of a metal forming the first via land and a crystal of a metal forming the via conductor are continuous with each other.

7. A method of manufacturing a wiring board,
the wiring board comprising:
a first insulating layer and a second insulating layer;
a first wiring conductor layer located between the first insulating layer and the second insulating layer and comprising a first via land;
a second wiring conductor layer located on the second insulating layer and comprising a second via land;
a via hole penetrating from an upper surface to a lower surface of the second insulating layer; and
a via conductor located in the via hole and electrically connecting the first via land and the second via land, wherein
the via conductor is located on an inner surface of the via hole and on the first via land via a first base layer containing nichrome and a second base layer located on an upper surface of the first base layer and containing the same metal as a metal forming the via conductor, and
an alloy layer containing the same metal as a metal forming the first wiring conductor layer, tin, and nichrome is located between the first via land and the first base layer,
the method comprising:
layering the second insulating layer via a metal layer containing tin and a layer containing a coupling agent, on the first wiring conductor layer located on the first insulating layer and comprising the first via land;
forming the via hole in the second insulating layer, the via hole penetrating from the upper surface to the lower surface of the second insulating layer;
forming, by sputtering, the first base layer formed of nichrome on the inner surface of the via hole and an upper surface of the first via land;
forming, by sputtering, the second base layer on the upper surface of the first base layer; and
forming the via conductor in the via hole.

8. The method of manufacturing a wiring board according to claim 7, wherein a temperature at a time of forming the second base layer is not lower than a temperature at a time of forming the first base layer.

9. The method of manufacturing a wiring board according to claim 7, wherein an alloy layer is formed entirely between the first via land and the first base layer.

10. The method of manufacturing a wiring board according to claim 7, wherein the first wiring conductor layer is formed of copper.

11. The method of manufacturing a wiring board according to claim 7, wherein the via conductor located entirely within the via hole and the second wiring conductor layer located on the second insulating layer are simultaneously formed.

12. The method of manufacturing a wiring board according to claim 7, wherein the via hole is formed by a laser.

\* \* \* \* \*